(12) United States Patent
Fujimoto et al.

(10) Patent No.: US 7,858,508 B2
(45) Date of Patent: Dec. 28, 2010

(54) SEMICONDUCTOR DEVICE AND METHOD OF MANUFACTURING THE SAME

(75) Inventors: Hiroyuki Fujimoto, Tokyo (JP); Yasuhiko Ueda, Tokyo (JP); Fumiki Aiso, Tokyo (JP); Yuki Koga, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 827 days.

(21) Appl. No.: 11/717,707

(22) Filed: Mar. 14, 2007

(65) Prior Publication Data

US 2007/0224763 A1 Sep. 27, 2007

(30) Foreign Application Priority Data

Mar. 16, 2006 (JP) .............................. 2006-072651

(51) Int. Cl.
*H01L 21/306* (2006.01)
*H01L 21/336* (2006.01)
(52) U.S. Cl. .............. 438/589; 438/700; 257/E21.215; 257/E21.324; 257/E21.428
(58) Field of Classification Search ................ 438/589, 438/700; 257/E21.215, E21.324, E21.428
See application file for complete search history.

(56) References Cited

U.S. PATENT DOCUMENTS 7,205,217 B2* 4/2007 Huang et al. ................ 438/589
2007/0099384 A1* 5/2007 Han et al. ................... 438/270
2007/0200169 A1* 8/2007 Kim .......................... 257/330
2007/0221977 A1* 9/2007 Tanaka ....................... 257/302
2007/0232042 A1* 10/2007 Cho .......................... 438/589
2007/0254465 A1* 11/2007 Jung ......................... 438/589
2007/0281455 A1* 12/2007 Kim .......................... 438/589

OTHER PUBLICATIONS

S-RCAT (Sphere-shaped-Recess-Channel-Array-Transistor) Technology for 70nm DRAM feature size and beyond (2005 Symposium on VLSI Technology Digest of Technical Papers) pp. 34 and 35.

* cited by examiner

*Primary Examiner*—Mary Wilczewski
*Assistant Examiner*—Toniae M Thomas
(74) *Attorney, Agent, or Firm*—Young & Thompson

(57) ABSTRACT

In a method of manufacturing a semiconductor device, a trench is formed to have an upper quadrangular section and a lower circular section which is formed through a hydrogen annealing process, to extend in a depth direction of a semiconductor substrate. An insulating film is formed on a surface of the trench and a surface of the semiconductor substrate. A conductive film is formed to fill the trench whose surface is covered with the an insulating film. Source/drain regions are formed on both sides of the trench.

15 Claims, 20 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Related Art

A semiconductor device is known in which an n-type diffusion layers, a gate insulating film and a gate electrode are formed in a semiconductor substrate. FIG. 1 is a cross section view showing the structure of a conventional semiconductor device. In the semiconductor device, a transistor structure is formed between trench type device isolation sections of a pair. Specifically, the n-type diffusion layers for a source region and a drain region are formed in the surface of the semiconductor substrate having a p-type well layer and a channel dope layer. The gate insulating film is formed on the substrate surface. A gate electrode 3 is formed through the gate insulating film on the substrate surface between the source region and the drain region. Also, electrodes are formed on the source region and the drain region, respectively. Moreover, a silicon oxide film is formed for the gate insulating film and the electrodes to be embedded.

In the semiconductor device having such a structure, a distance between the n-type diffusion layers becomes shorter in accompaniment with the advancement of the miniaturization of wiring lines. A threshold voltage of the gate electrode receives an influence of the n-type diffusion layer with the spread of the n-type diffusion layer. That is, an effective channel length becomes shorter. Consequently, it is difficult to obtain a desirable threshold voltage Vth.

In order to solve this problem, a semiconductor device is known which has an embedded gate electrode shown in FIG. 2. In the semiconductor device shown in FIG. 2, a trench is formed in the semiconductor substrate. The gate electrode is formed to be embedded in the trench through an gate insulating film. By employing the structure that the gate electrode is embedded in the trench, the effective channel length can be controlled in accordance with the depth of the trench. Thus, a higher threshold voltage can be obtained, as compared with a semiconductor device of a planner type shown in FIG. 1.

A semiconductor device of the embedded type as mentioned above is disclosed in Japanese Laid Open Patent Application (JP-A-Heisei 4-306881). An insulating gate type semiconductor device in this first conventional example includes a semiconductor substrate of one conductive type, trenches formed in the semiconductor substrate. The film thickness of a gate insulating film is thinner at a bottom surface of the trench than that at a side of the trench. A gate electrode is formed inside the trench through the gate insulating film. A low concentration diffusion layer of an opposite conductive type is formed to be deeper than the trench in the semiconductor substrate adjacent to the trench, and a high concentration diffusion layer of an opposite conductive type is formed in the low concentration diffusion layer adjacent to the gate electrode and is shallower than the trench.

Also, a single electron tunnel device is disclosed in Japanese Laid Open Patent Application (JP-A-Heisei 8-306904). In this second conventional example, a U-shaped trench is formed in a silicon thin line and a thermal oxidization is performed thereon. A portion near the bottom of the U-shaped trench to which stress is applied is slower in oxidization rate than a portion near a trench side wall, and irregularity is consequently generated in an oxide film thickness. A gate electrode is formed on the oxide film, and a positive gate voltage is applied. At this time, electrons are accumulated in the bottom center of the U-shaped trench in which the oxide film is thin, and a tunnel barrier is formed in the portion of a thick oxide film near the trench side wall.

However, when the miniaturization is further advanced, it is difficult to obtain a desirable threshold voltage Vth even in the semiconductor device of the embedded type as mentioned above.

On the other hand, a technique is known in which a section of an upper portion of a trench in which a gate electrode is embedded is rectangular and a section of a lower portion is rounded. Hereinafter, a semiconductor device having such a structure is referred to as a round bottom type. As a semiconductor device of the round bottom type, for example, there is a semiconductor device described in "S-RCAT (Sphere-shaped-Recess-Channel-Array-Transistor) Technology for 70 nm DRAM feature size and beyond" (2005 Symposium on VLSI Technology Digest of Technical Papers: third conventional example). Since the lower portion of the trench is processed to have a circular section, the effective channel length can be made longer than that of a usual gate embedded type transistor. Thus, even if the miniaturization of the transistor is advanced, a desirable threshold voltage can be obtained. Moreover, since the trench bottom has a curved portion, the electric field received from the gate electrode can be made greater in that portion. Therefore, this has a merit that a sub threshold coefficient can be made smaller and an ON current of the transistor can be made greater.

In the semiconductor device of the round bottom type, the fact is known that as a curvature of the trench bottom becomes smaller, the transistor characteristic is degraded. As the curvature becomes smaller, the electric field received from the gate electrode becomes weaker in that portion, and the sub threshold coefficient becomes greater. That is, the curvature of the trench bottom is desired to be greater, and it is desired to have the shape close to a true circle.

In the semiconductor device in the first conventional example, when the semiconductor device of the round bottom type is manufactured, the following process is used. At first, a p-well layer and a channel dope layer are formed, and a hard mask is formed on the semiconductor substrate in which device separation sections are formed, as shown in FIG. 3A. Then, lithography is used to etch a portion for the trench to be formed, and a protection layer is deposited on the substrate having a silicon recess, as shown in FIG. 3B. In succession, an isotropic etching is carried out to form a lower circular portion, as shown in FIG. 3C. Moreover, a side mask (protection layer) formed on the side of the trench and the hard mask are removed, as shown in FIG. 3D. Then, a known method is used to form a gate electrode, as shown in FIG. 3E.

In this way, the shape that is actually formed when the isotropic etching is carried out to form the lower circular section will be described with reference to FIGS. 4 and 5. FIG. 4 is a diagram when only the silicon recess portion is shown in FIG. 3B. In the isotropic etching, the regression of a silicon surface appears at the equal distance from the silicon surface. Thus, the sectional shape after the etching is likely to be expanded into a lateral direction, and it is not the true circle, as shown in FIG. 5. Moreover, when the isotropic etching is carried out, a residue (crystal defect) is generated inside the trench, and it becomes difficult to uniformly form the gate insulating film. Thus, in order to form the uniform gate insulating film and further increase the ON current, another process is required.

In conjunction with the above description, Japanese Laid Open Patent Application (JP-P2002-231945A: third conventional example) discloses a technique that carries out a hydrogen annealing process to decrease crystal defects generated inside a trench.

Also, Japanese Laid Open Patent Application (JP-P2003-229479A: fourth conventional example) discloses a technique that carries out the hydrogen annealing process to round trench corner portions. That is, the fourth conventional example describes a method of forming a trench in a surface layer of a semiconductor device, and after removing a protection layer formed on the side wall of the trench and before forming a gate insulating film along the side wall of the trench, carrying out a hydrogen annealing.

Also, Japanese Laid Open Patent Application (JP-P2005-45198A) discloses the structure of a recess gate transistor which has an impurity implantation layer formed in an active region defined in a substrate. In the structure, a first electrode region formed in the active region from a top surface of the active region to a depth which is shallower than to the impurity implantation layer. A gate is extended from a lower portion of the first electrode region to a predetermined depth, passing through the impurity implantation layer and contains a second electrode region larger than a horizontal size of the first electrode region. An insulating film spacer is formed to introduce a difference of the horizontal size between the first and second electrodes into a side wall of the first electrode region. A gate insulation film is formed in the second electrode region to have a constant thickness. Source/drain regions are formed to oppose to each other through the gate with respect to the active region.

However, any of the foregoing conventional examples does not disclose a technique for processing the lower sectional shape of the trench to a shape close to the true circle, while suppressing the residue generated inside the trench.

SUMMARY OF THE INVENTION

Therefore, it is an object of the present invention to provide a semiconductor device in which a lower portion of a trench is processed to a shape of a true circle, and a method of manufacturing the same.

Another object of the present invention is to provide a semiconductor device in which a lower portion of a trench is processed to a shape of a true circle, while suppressing a residue generated when the trench is formed by etching, and a method of manufacturing the same.

In an aspect of the present invention, a method of manufacturing a semiconductor device, is achieved by forming a trench having an upper quadrangular section and a lower circular section which is formed through a hydrogen annealing process, to extend in a depth direction of a semiconductor substrate; by forming an insulating film on a surface of the trench and a surface of the semiconductor substrate; and by forming a conductive film to fill the trench whose surface is covered with the an insulating film.

In this case, the method may be achieved by further forming as source/drain regions, diffusion regions in the semiconductor substrate on both sides of the trench, wherein the conductive film is a gate electrode.

Also, a relation L>W is met, where L is a depth for the lower section and W is a width of the upper section of the trench. More preferably, a relation L>1.12W is met.

Also, the forming a trench may be achieved by forming a mask on the semiconductor substrate through an oxide film; by forming the trench for the upper section by etching a part of the mask and a part of the semiconductor substrate; by forming a protection film along a side surface of the trench for the upper section; by forming the trench for the lower section by etching a part of the semiconductor substrate in the depth direction of the semiconductor substrate; and by performing the hydrogen annealing process to transform the lower section to have a circular section.

In this case, when the mask is a silicon nitride film, the protection film is a laminate layer of a lower protection film of silicon oxide and an upper protection film of silicon nitride, and the oxide film on the semiconductor substrate is a silicon oxide film, the forming a trench may be achieved by further forming a sacrificed silicon oxide film on a surface of the lower section; removing the mask and the upper protection film; and removing the silicon oxide film on the semiconductor substrate, the lower protection film and the sacrificed silicon oxide film.

Also, the forming an insulating film may be achieved by forming the insulating film through thermal oxidization.

Another aspect of the present invention, a method of manufacturing a semiconductor device, is achieved by forming a hard mask on a semiconductor substrate through an oxide film; by forming a shallow trench by etching a part of the hard mask and the oxide film and a part of the semiconductor substrate; by forming a protection film along a surface of the shallow trench; by forming a deep trench in a depth direction from the shallow trench by etching the protection film in a bottom of the shallow trench and another part of the semiconductor substrate while keeping the protection film on a side wall of the shallow trench; and by processing the deep trench into a circular trench through a hydrogen annealing process.

A depth L of a portion to be etched in the forming a deep trench meets a relation L>W, where W is a width of the shallow trench.

Also, the method may be achieved by further forming a gate insulating film along a surface of the circular trench; and forming a gate electrode by filling the circular trench whose surface is covered with the gate insulating film.

In still another aspect of the present invention, a semiconductor device includes a semiconductor substrate; a trench formed in the semiconductor substrate; a gate insulating film formed on a surface of the semiconductor substrate and a surface of the trench; a gate electrode formed to fill the trench in which the gate insulating film is formed; and diffusion layers provided in the semiconductor substrate on both sides of the trench. A lower portion of the trench is substantially true circle.

A sectional shape of an upper section of the trench may be a quadrangle.

Also, a sectional shape of a lower section of the trench may be a circle with a relation of R>0.5W, where a radius of the lower section is R and a width of the upper section of the trench is W. In this case, it is more preferable that a relation R>0.56W is met.

DESCRIPTION OF THE PREFERRED EMBODIMENTS

Hereinafter, a semiconductor device and a method of manufacturing the same according to the present invention will be described in detail with reference to the attached drawings.

Figure 1:
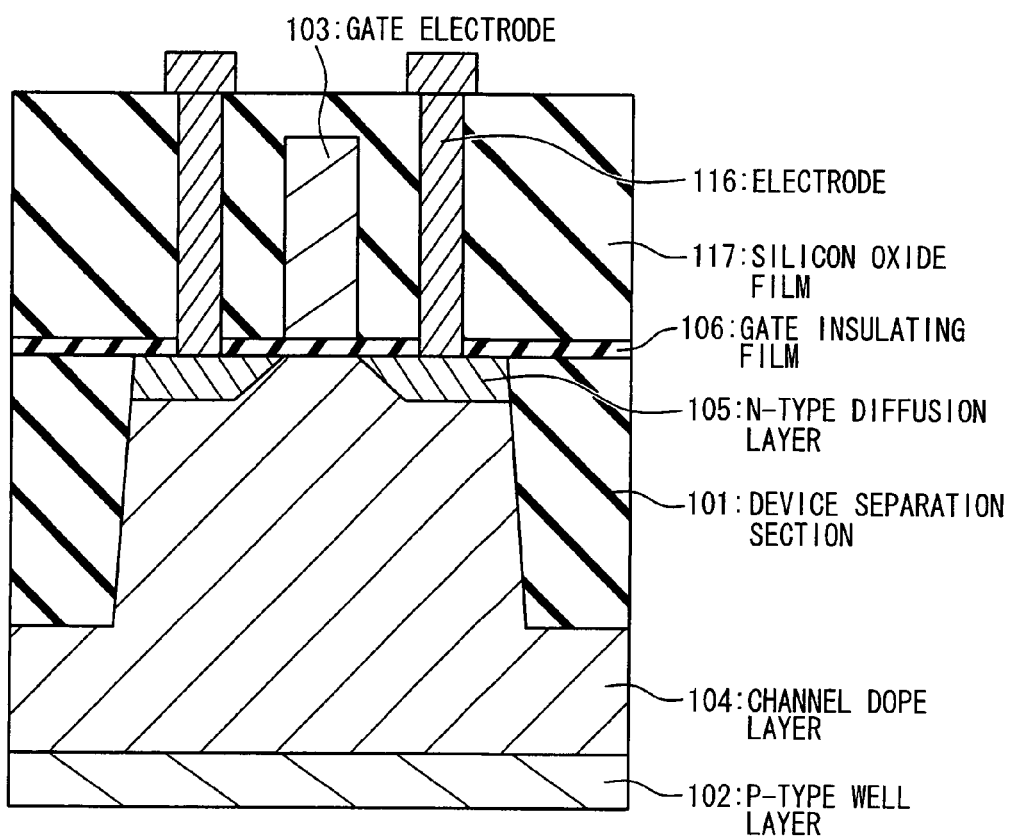
FIG. 1 is a cross sectional view showing the structure of a conventional semiconductor device.
Figure 2:
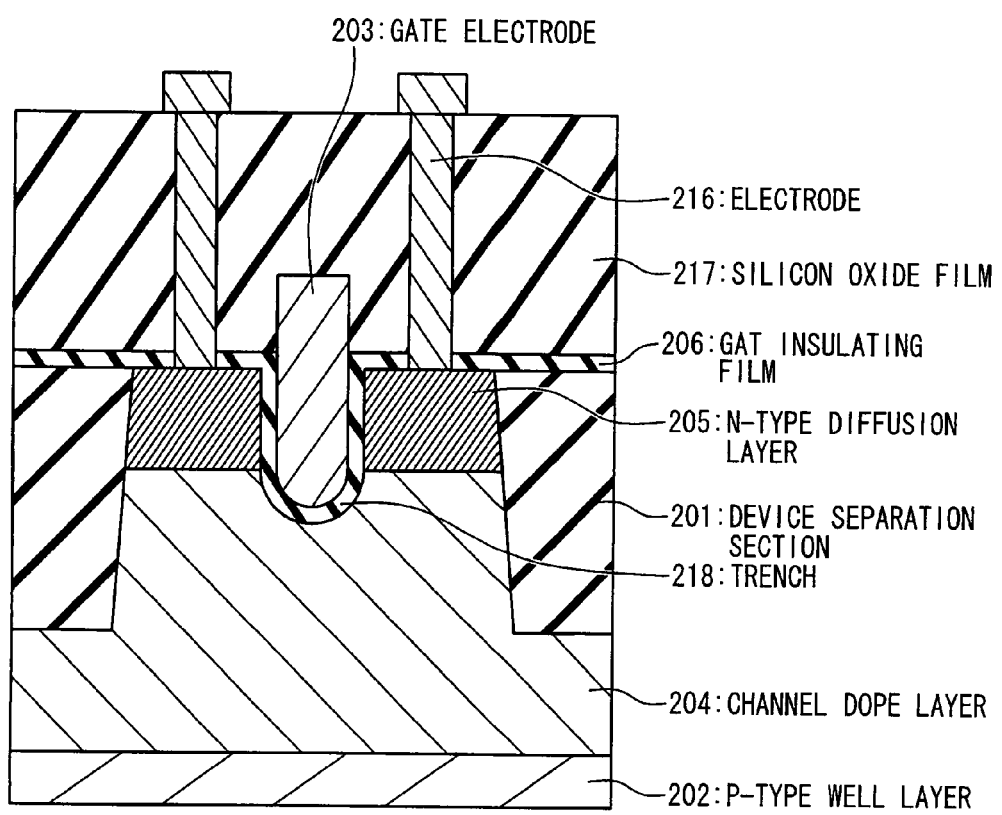
FIG. 2 is a cross sectional view showing the structure of another conventional semiconductor device.
Figure 3A:
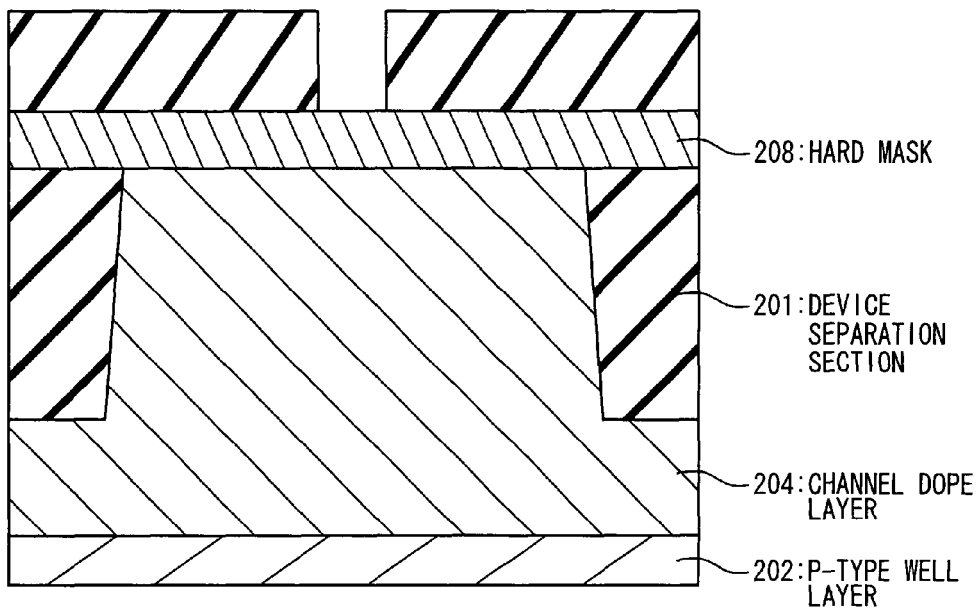
FIGS. 3A to 3E are cross sectional views showing the structure of another semiconductor device in a method of manufacturing the same.
Figure 3B:
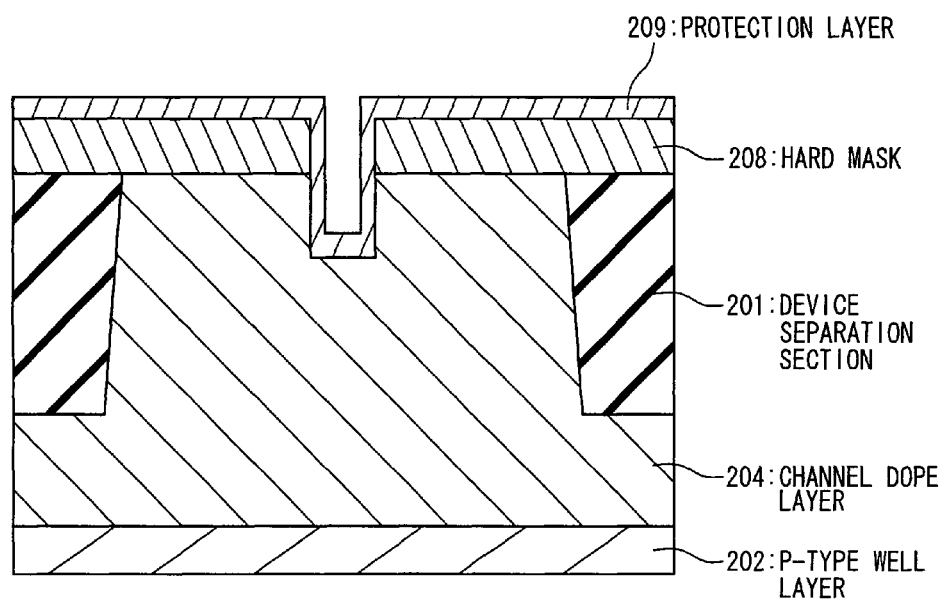
Figure 3C:
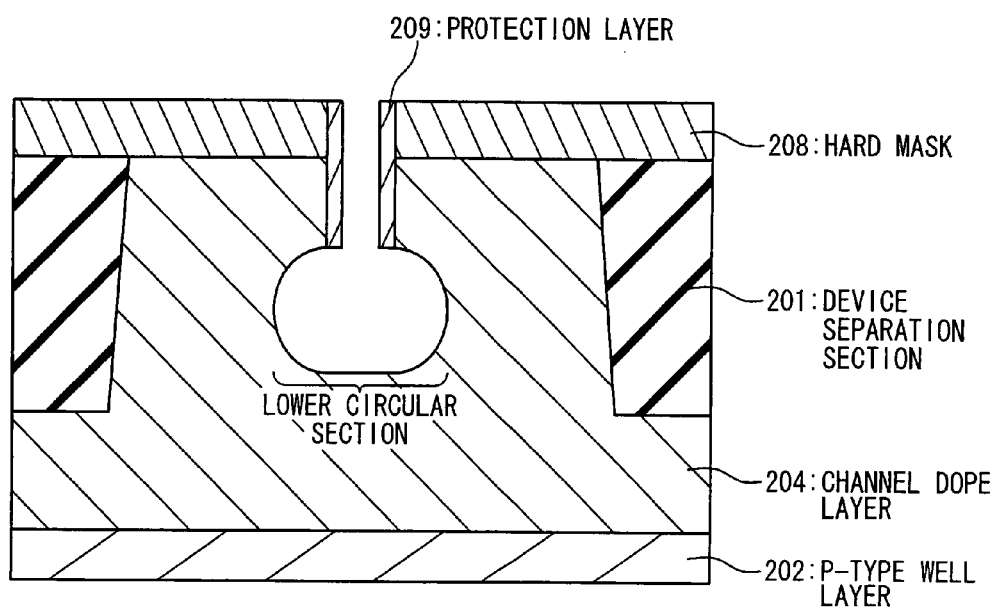
Figure 3D:
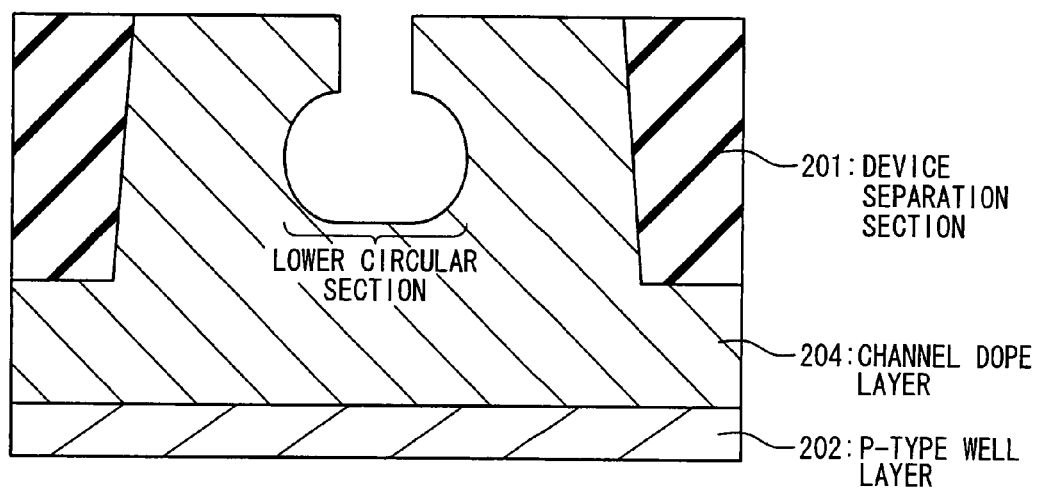
Figure 3E:
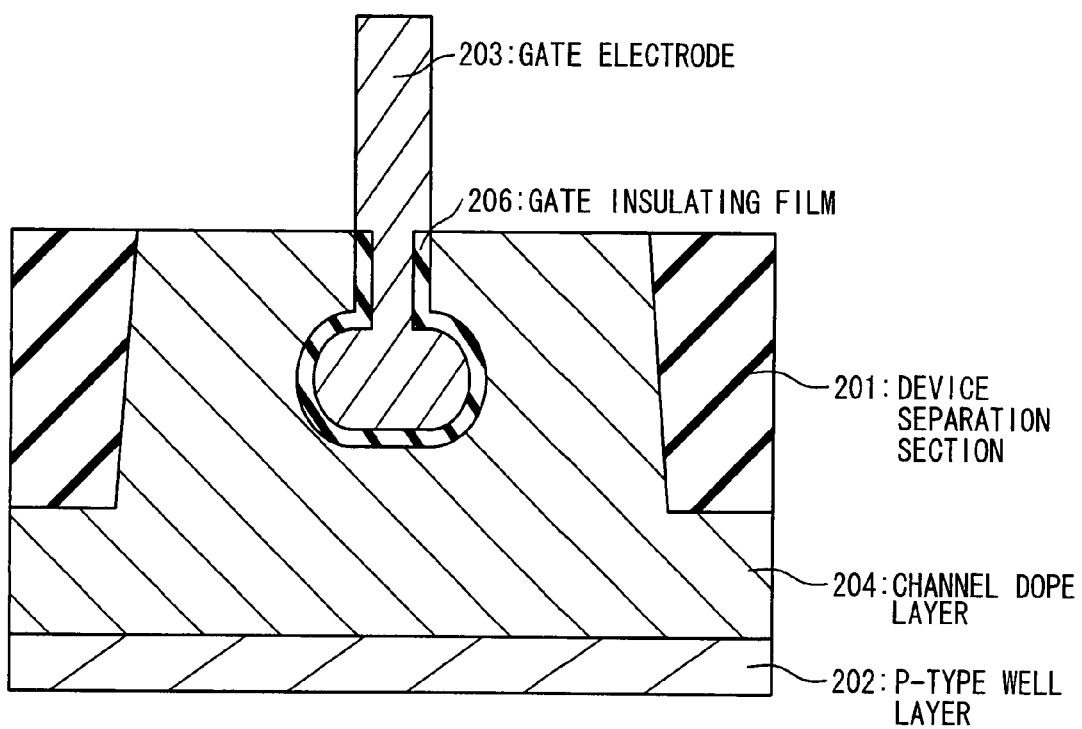
Figure 4:
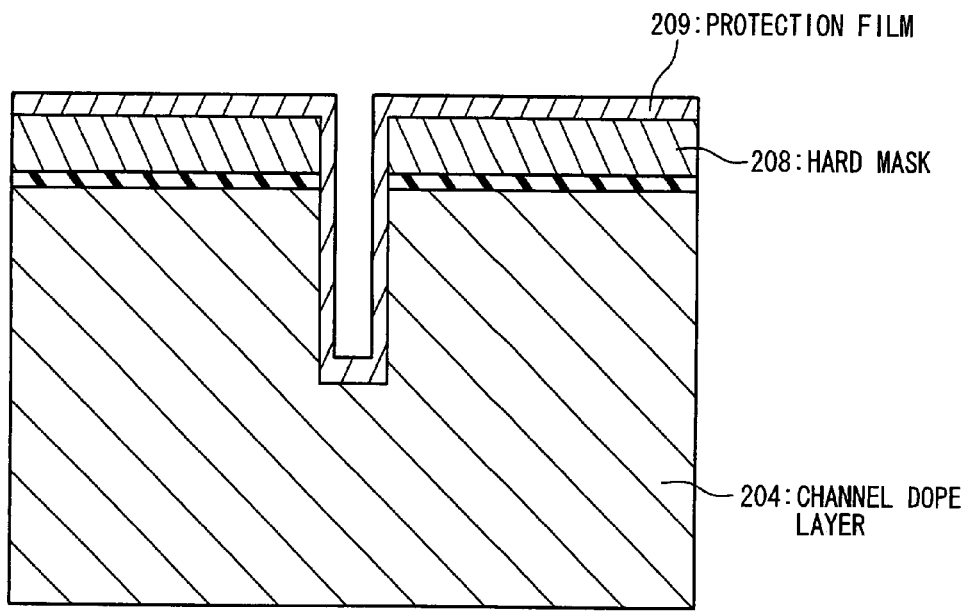
FIG. 4 is a cross sectional view showing the structure of a trench in the semiconductor device shown in FIGS. 3A to 3E.
Figure 5:
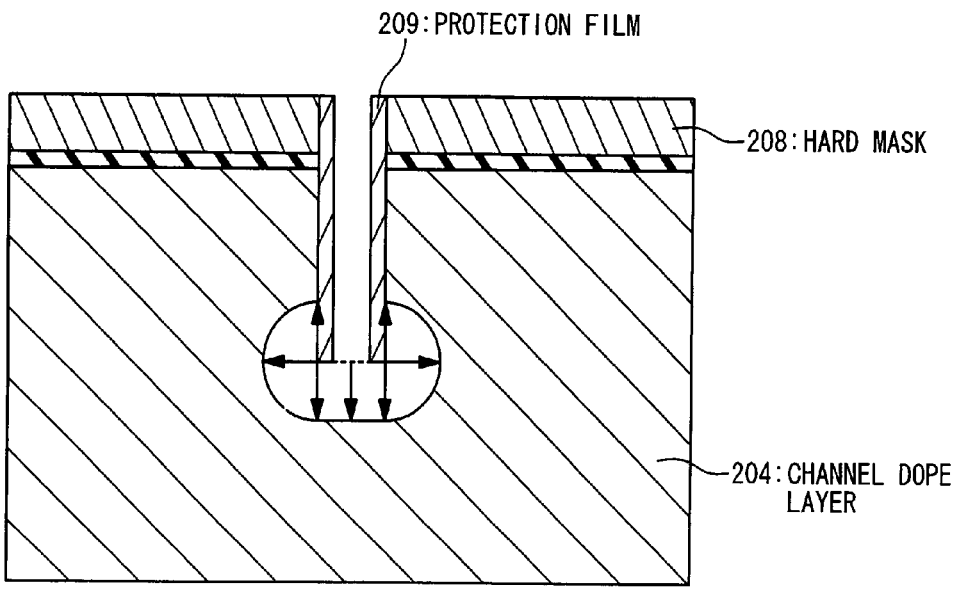
FIG. 5 is a cross sectional view showing formation of a lower section of the trench in the semiconductor device shown in FIGS. 3A to 3E.
Figure 6:
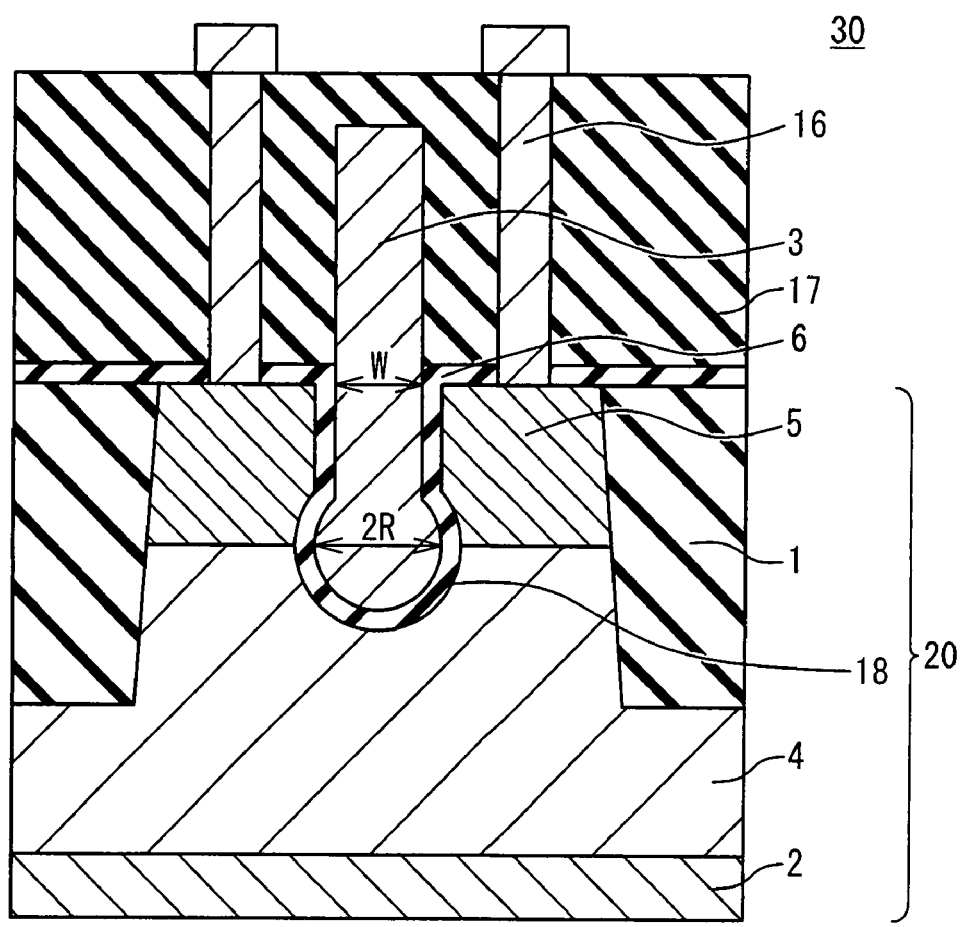
FIG. 6 is a cross sectional view showing the structure of a semiconductor device according to an embodiment of the present invention.

FIG. 6 is a cross sectional view showing the sectional structure of a semiconductor device 30 according to an embodiment of the present invention. In this embodiment, an n-type channel MOS transistor is exemplified and described as the semiconductor device 30. The semiconductor device 30 has a semiconductor substrate 20, a gate insulating film 6, a gate electrode 3, a silicon oxide layer 17 and electrodes 16. A p-type well layer 2, a channel dope layer 4, n-type diffusion layers 5, a trench 18 and a pair of device separation sections 1 are formed in the semiconductor substrate 20. For example, in a semiconductor memory device, the gate electrode 3 extends in a row direction as a word line (not shown). One of the diffusion layers 5 is connected with a bit line (not shown) extending in a column direction. A memory cell (not shown) is formed at an intersection of the word line and the bit line. The memory cells are arranged in a matrix in a memory cell array (not shown). The detail of each section will be described below.

The device separation sections 1 are formed near the surface of the semiconductor substrate 20 and a region on the semiconductor substrate is divided into a plurality of regions. The p-type well layer 2 is formed in a portion deeper than the device separation sections 1. The channel dope layer 4 is formed in a portion shallower than the p-type well layer 2. The n-type diffusion layer 5 is formed in a portion that is further shallower than the channel dope layer 4 and sandwiched between the pair of device separation sections 1. The trench 18 is formed to penetrate the n-type diffusion layer 5 from the surface of the semiconductor substrate 20. With the sectional shape of the trench 18, the upper portion is rectangular, and the lower portion is substantially true circular. The upper shape of the trench 18 is not especially limited. This is because, even if the side wall of the upper rectangular portion is vertical or tapered, there is not a large difference in the electric field in the channel portion. The bottom of the trench is in contact with the channel dope layer 4. The gate insulating film 6 is formed on the surface of the semiconductor substrate 20. The gate insulating film 6 is also formed to follow the inner surface of the trench 18. The gate electrode 3 is formed to have a lower portion embedded in the trench 18. In the portion embedded in the trench 18, the gate electrode 3 is formed on the surface of the semiconductor substrate through the gate insulating film 6. It should be noted that the upper portion of the gate electrode 3 protrudes from the semiconductor substrate 20. The n-type diffusion layer 5 has a source region and a drain region to put the trench between them. The electrode 16 is connected to each of the source and drain regions.

On the semiconductor substrate 20, the silicon oxide film 17 is formed through the gate insulating film 6. The gate electrode 3 is fully embedded in the his silicon oxide layer 17, and the electrodes 16 are arranged to be embedded in the silicon oxide layer 17. It should be noted that the upper ends of the electrodes 16 reach the surface of the silicon oxide layer 17, and wiring patterns are connected with the upper ends of the electrodes 16.

In the semiconductor device 20, since the lower portion of the trench 18 is processed to the shape of the true circle, the curvature of the trench bottom becomes maximal. Consequently, when a voltage is applied to the gate, the ON current of the transistor can be maximized. Since the electric field received from the gate electrode becomes great at this portion, a sub threshold coefficient can be made small.

The shape of the trench 18 will be further described in detail. As mentioned above, the sectional shape of the trench 18 is rectangular in the upper portion and substantially true circular in the lower portion. Here, when the width of the portion having the upper rectangular section is assumed to be W and the curvature radius of the lower circular section is assumed to be R, it is preferable that the shape meets a relation of R>0.5W. That is, the diameter of the lower circular section is preferred to be larger than the width of the upper rectangular portion. This reason will be described below.

In the semiconductor device, the electric field (effective electric field) of an effective channel portion indicates the dependency on the curvature radius of the corner portion of the trench bottom. When the curvature radius is 100 nm or more, the effective electric field is 90% or more of the electric field of a flat portion. However, as the curvature radius becomes smaller, the effective electric field is gradually reduced. For example, when the curvature radius is 50 nm, the effective electric field is reduced to about 70% of the flat portion. As a result, the sub threshold coefficient increases. For example, although the sub threshold coefficient of the flat portion is about 80 mV/dicade, this is increased to 115 mV/dicade when the curvature radius is 50 nm.

Usually, the allowable falling range of the effective electric field is about 10%. The increase in the sub threshold coefficient is allowable until about 10%. If the effective electric field is further reduced so that the sub threshold coefficient is increased, a defective device is likely to be generated. For example, the increase in the sub threshold coefficient causes increases in the OFF current and increases in defects such as deterioration in a data holding characteristic. In consideration of them, the decrease in the effective electric field and the increase in the sub threshold coefficient are both desired to be 10% or less.

From the above reasons, the curvature radius R is preferred to be greater than 0.5W. If the curvature radius R becomes smaller than 0.5W, there is a case that the sub threshold coefficient is increased by 10% or more. Also, the maximum curvature radius R when the physical contact of the adjacent transistors with each other because of a space of the trench can be prevented becomes an upper limit. It should be noted that the curvature radius R is further preferred to be greater than 0.56W.

Figure 7A:
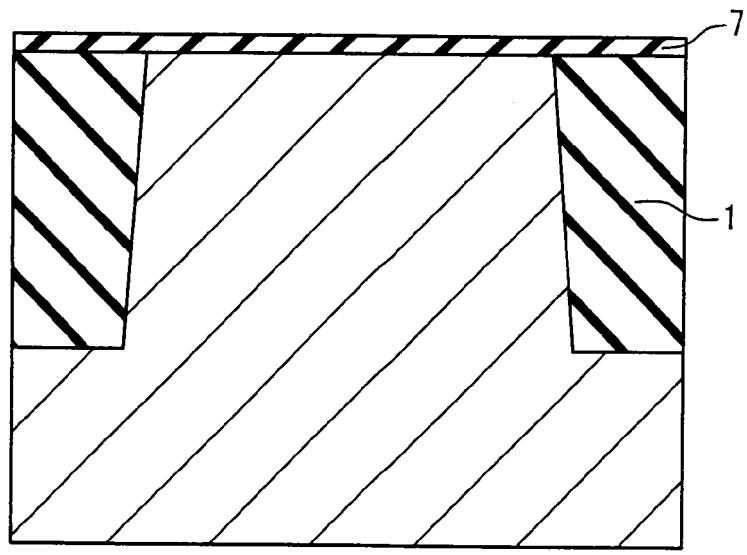
FIGS. 7A to 7P are cross sectional views showing the structure of the semiconductor device of the embodiment in a method of manufacturing the same.
Figure 7B:
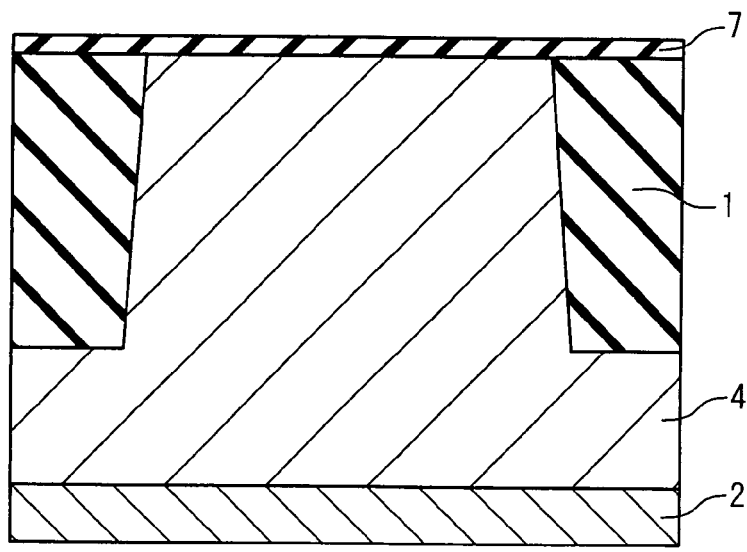
Figure 7C:
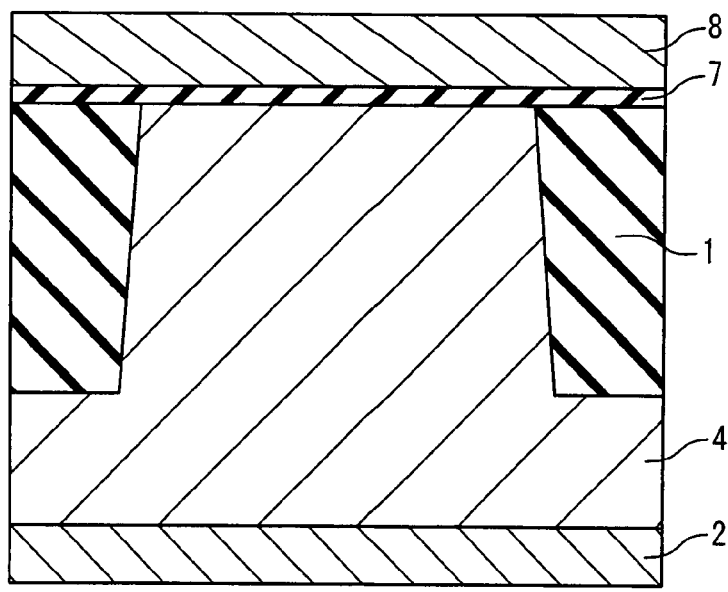
Figure 7D:
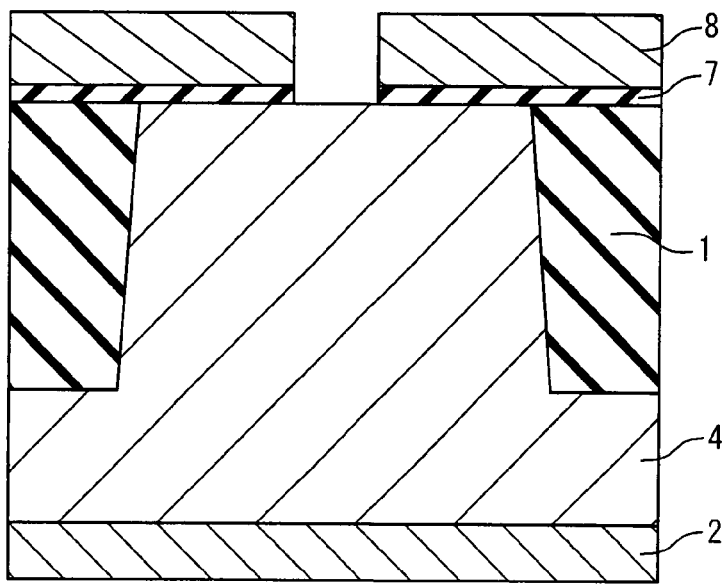
Figure 7E:
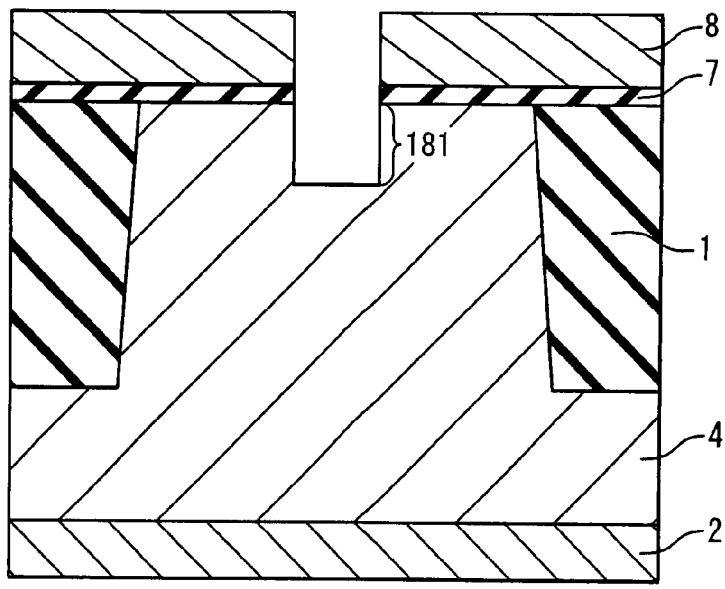
Figure 7F:
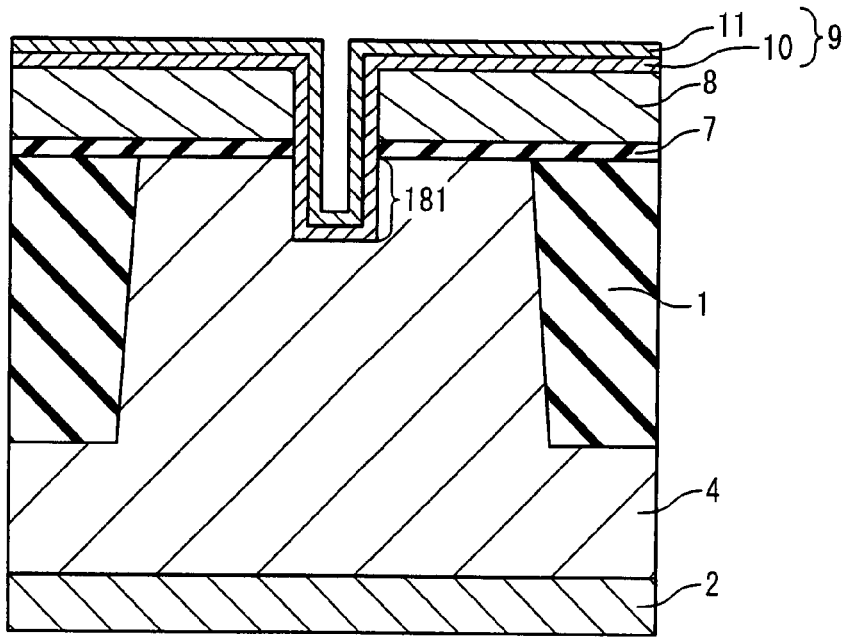
Figure 7G:
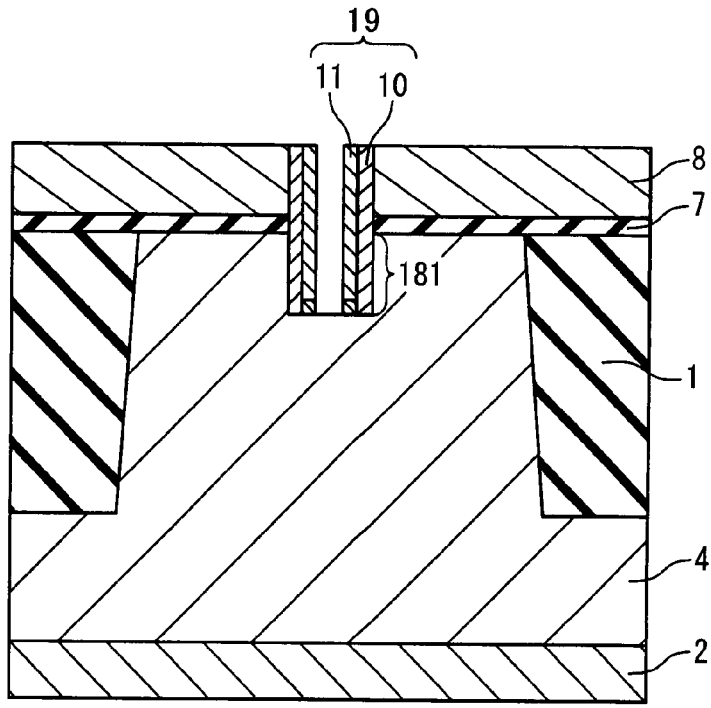
Figure 7H:
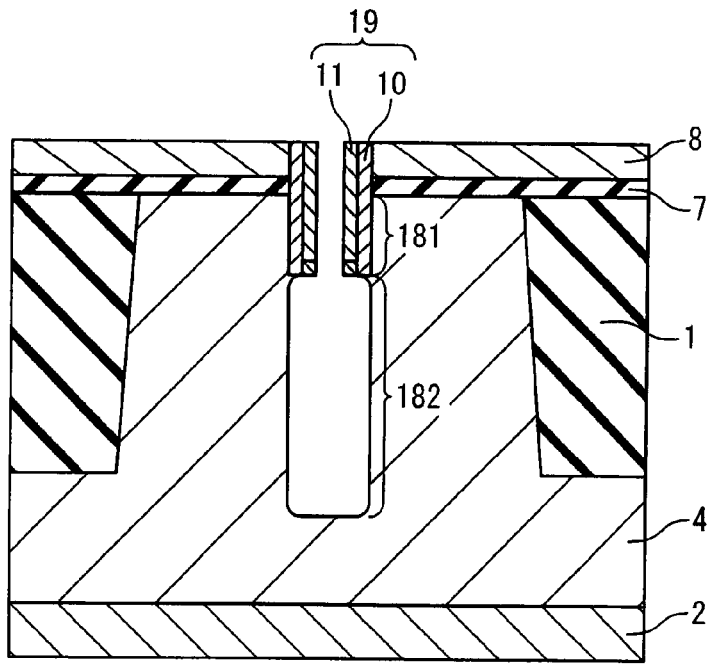
Figure 7I:
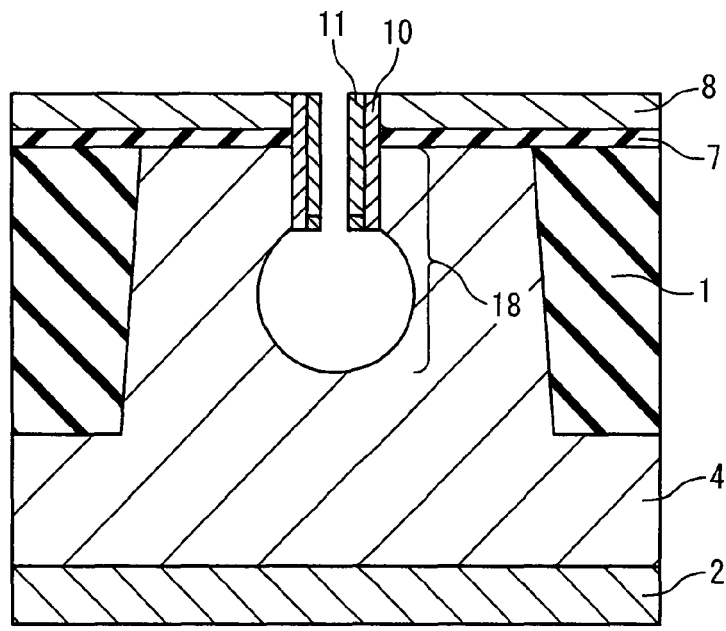
Figure 7J:
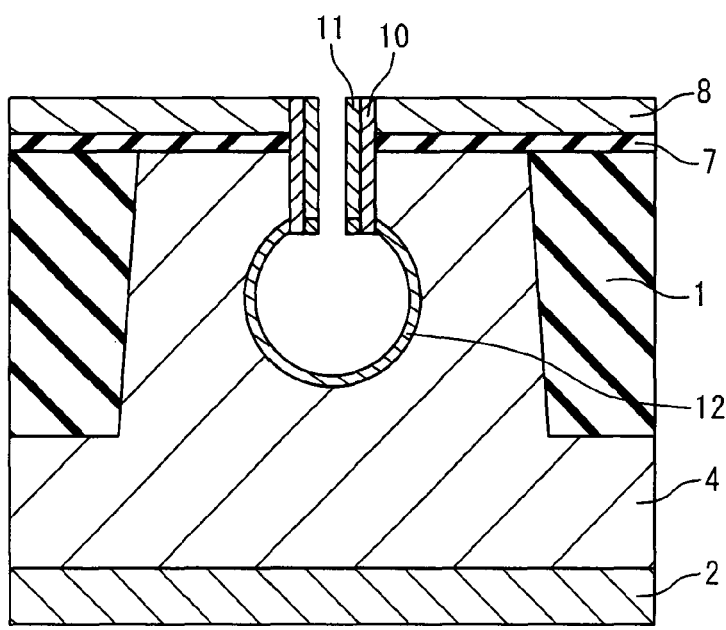
Figure 7K:
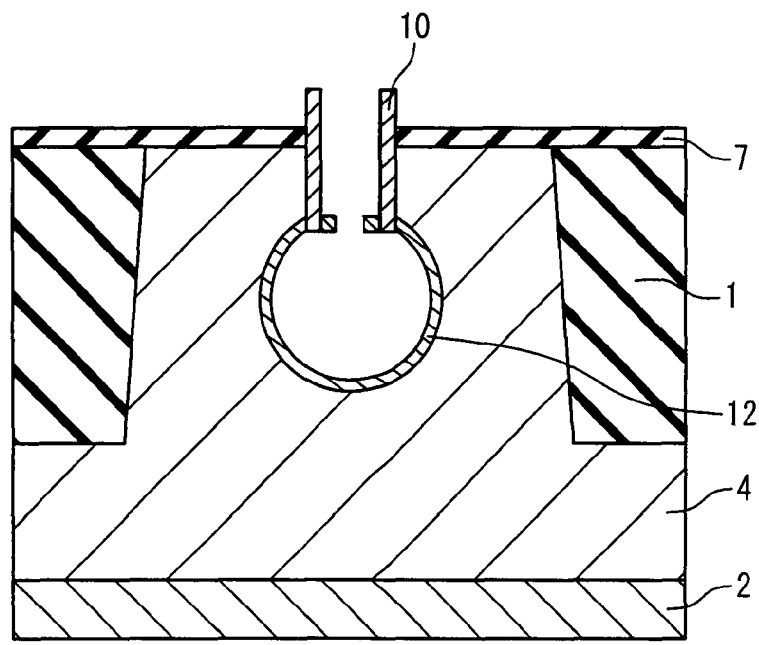
Figure 7L:
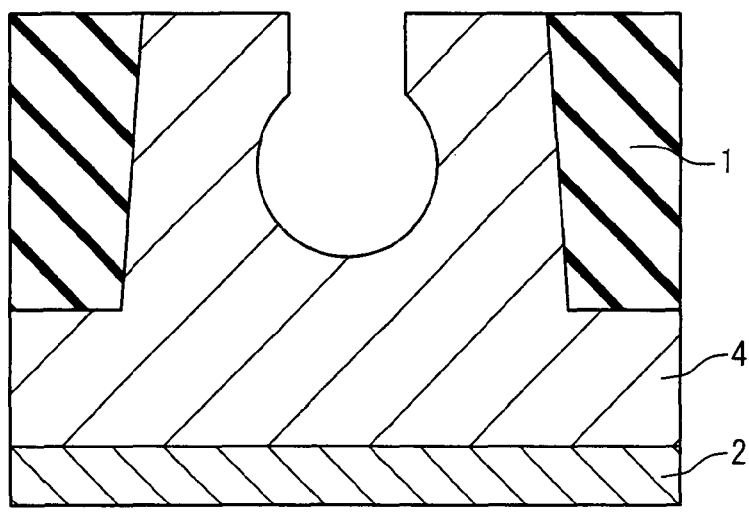
Figure 7M:
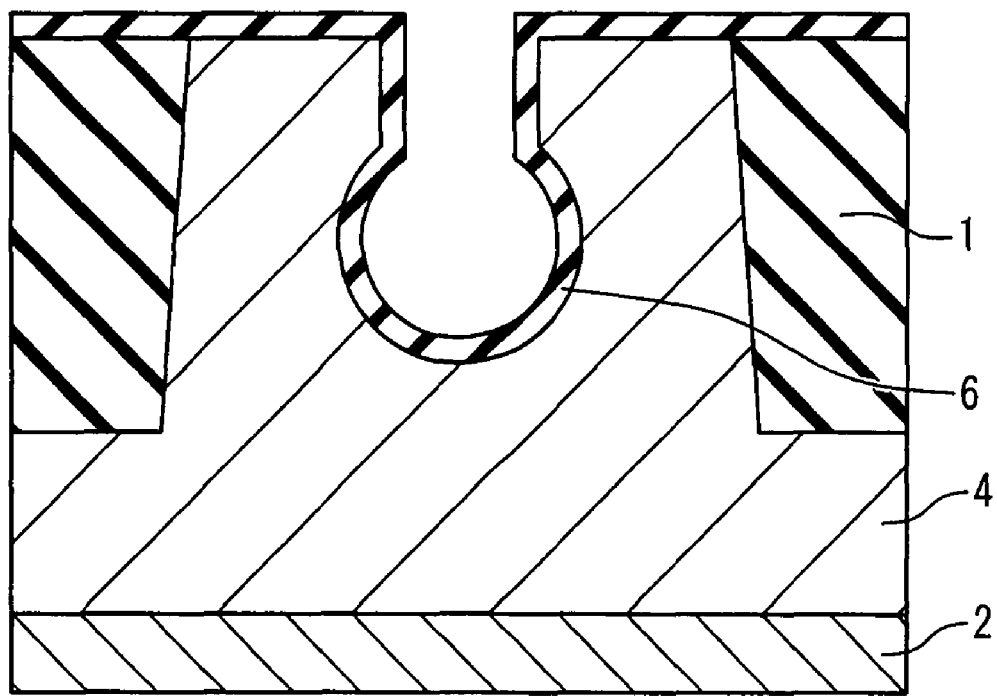
Figure 7N:
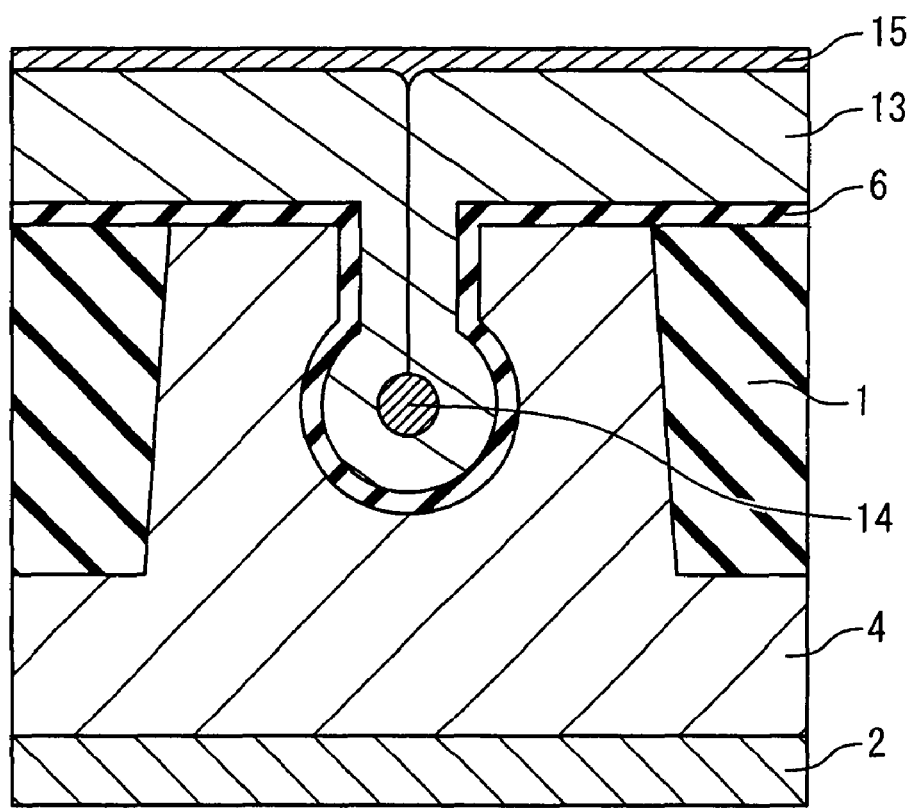
Figure 70:
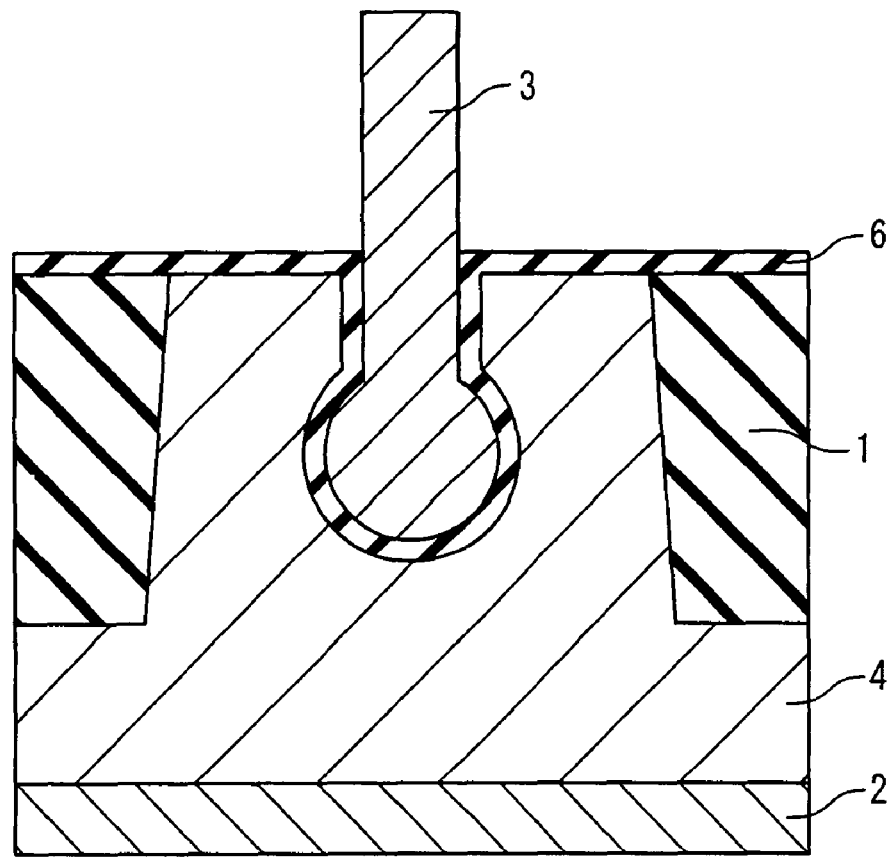
Figure 7P:
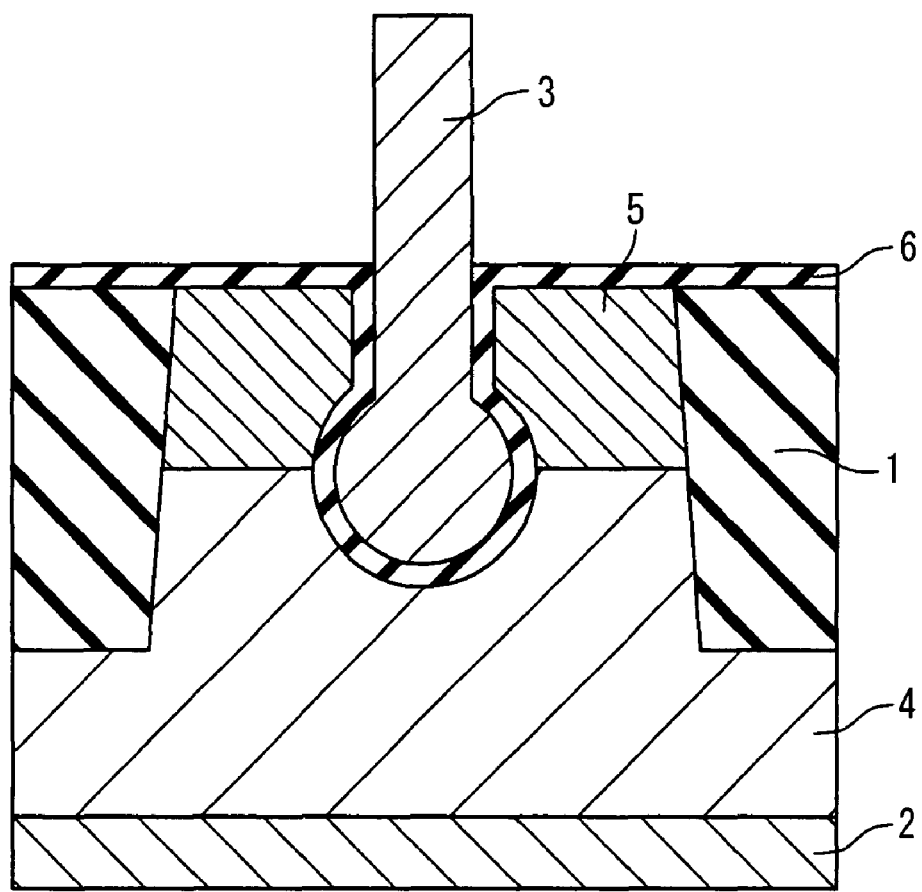
Figure 8:
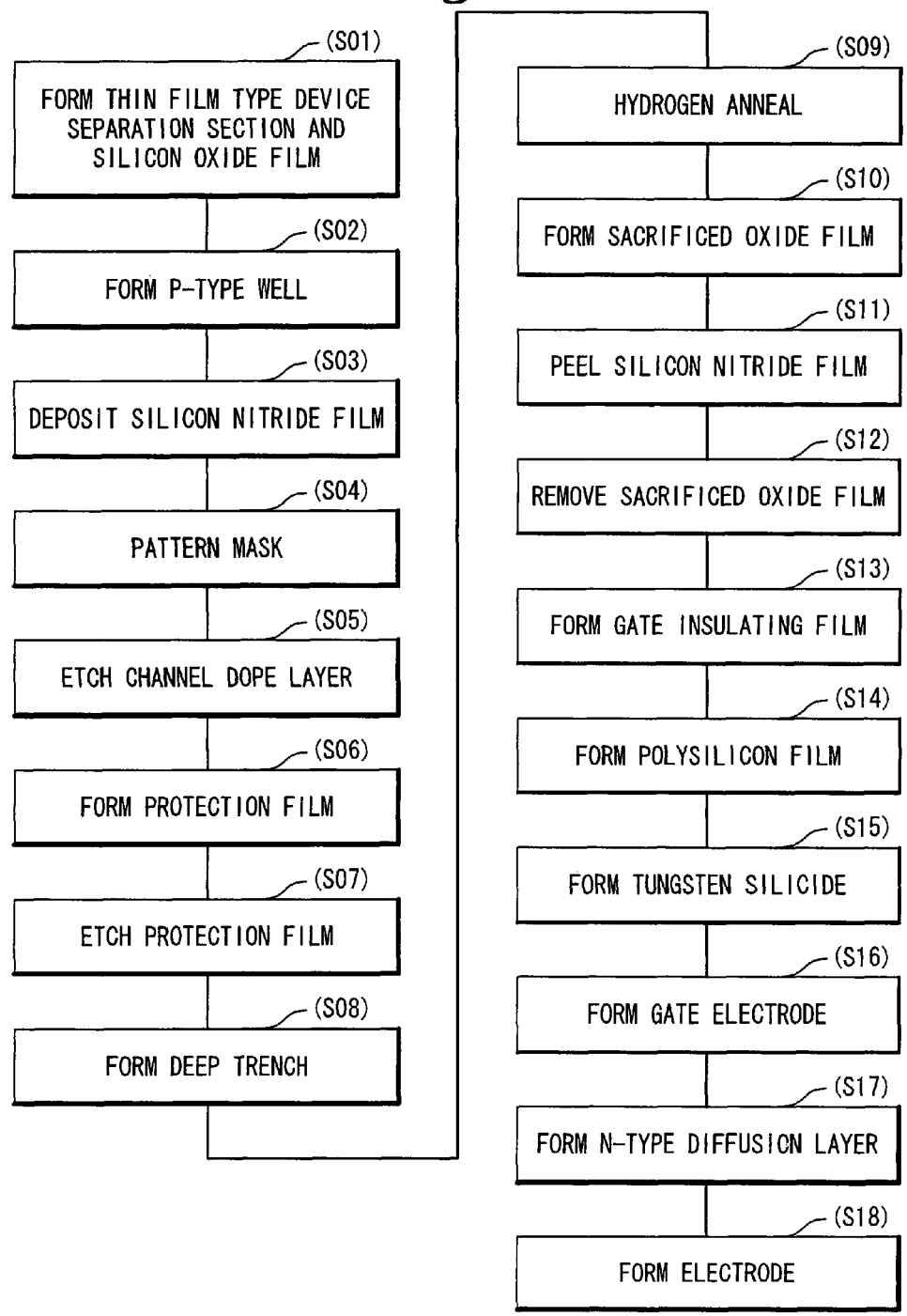
FIG. 8 is a flowchart showing the method of manufacturing the semiconductor device of the present invention.

Next, the method of manufacturing the semiconductor device according to this embodiment will be described below. FIG. 8 is a flowchart of the method of manufacturing the semiconductor device. Also, FIGS. 7A to 7P are cross sectional views of the semiconductor device in the method of manufacturing it.

Step S01 (FIG. 7A): Formation of Device Separation Sections and Silicon Oxide Film At first, the trenches for the device separation are formed in the semiconductor substrate such as a silicon substrate. Then, each trench is filled with a silicon oxide film and the device separation sections 1 are formed. Moreover, a silicon oxide film 7 is formed. Thus, at this time, the surface of the semiconductor substrate is covered with the silicon oxide film 7. Here, the depth of the device separation section 1 is 280 nm, for example.

Step S02 (FIG. 7B): Formation of p-Type Well Layer

Next, boron ions are implanted to form the p-type well layer 2. The boron implantation is carried out through the silicon oxide film 7 of the thickness of 10 nm. The implantation conditions are such as $1\times10^{13}/cm^2$ at 250 KeV, $5\times10^{12}/cm^2$ at 150 KeV and $3\times10^{12}/cm^2$ at 80 KeV. After the implantation of the boron ions, a thermal process is performed for recovery from damage. The condition of the thermal process at this time is 1000° C. for one minute, for example.

Moreover, the boron ions are implanted through the silicon oxide film 7, to form the channel dope layer 4 above the p-type well layer 2. The condition of the boron implantation at this time is $2\times10^{12}/cm^2$ at 30 KeV, for example.

Step S03 (FIG. 7C): Formation of Hard Mask

Next, a hard mask 8 is formed on the silicon oxide film 7. The hard mask 8 is formed from a silicon nitride film, for example. The film thickness of the silicon nitride film is preferable to be 50 nm.

Step S04 (FIG. 7D): Patterning of Hard Mask

Next, the hard mask 8 and the silicon oxide film 7 in a portion for a gate electrode to be formed are removed by a lithography technique and a dry-etching technique. The width of the portion to be removed at this time is, for example, 50 nm.

Step S05 (FIG. 7E): Etching of Channel Dope Layer

The hard mask 8 is used as a mask, and the dry-etching technique is used to etch the channel dope layer 4. Consequently, a shallow trench 181 is formed. The depth of the shallow trench 181 is 60 nm, for example.

Step S06 (FIG. 7F): Formation of Protection Film

Next, a protection layer 9 is formed. The protection layer 9 is formed on the hard mask 8 and one a portion following a shallow trench 181. As the protection layer 9, a laminate film in which the silicon oxide film 10 and a silicon nitride film 11 are laminated.

Step S07 (FIG. 7G): Etching of Protection Film

Anisotropic etching is performed on the protection layer (the silicon oxide film 10 and the silicon nitride film 11) in the depth direction. As the anisotropic etching, a reactive ion etching and the like are exemplified. Consequently, the protection layer (the silicon oxide film 10 and the silicon nitride film 11) formed on the bottom of the shallow trench 181 and the hard mask 8 is removed. The silicon in the channel dope layer 4 is exposed in the bottom of the shallow trench 181. On the other hand, the silicon oxide film 10 and the silicon nitride film 11 remain on the side wall of the shallow trench 181. In the following description, the protection layer remaining on the side wall is referred to as a side wall mask 19.

Step S08 (FIG. 7H): Formation of Deep Trench

The anisotropic etching is further performed on the channel dope layer 4 exposed in the bottom of the shallow trench 181. Consequently, a deep trench 182 is formed. Here, when silicon of the channel dope layer 4 and the silicon nitride of the side wall mask 19 are compared, the silicon is easier etched. Thus, the etching is not advanced in the lateral direction of the trench 18, because the side wall mask 19 plays a role of a mask. The etching is selectively advanced only in the depth direction. Thus, a trench shape having the aspect ratio of 10 or more can be formed. Also, as shown in FIG. 7H, the interface of the bottom of the side wall mask 19 and the portion of the deep trench 182 may be bored.

The size of the circular shape to be formed in the lower portion of the trench at a next step is determined in accordance with the depth etched at this step. Thus, by controlling the depth of the deep trench 182, a desirable circular shape can be obtained. The sectional shape in which the curvature radius R is larger than 0.56W as described above, can be attained by setting the depth etched at this step to be deeper than W. The depth of such a deep trench 182 (the distance between the bottom of the side wall mask and the bottom of the trench 18) is 260 nm, for example.

Step S09 (FIG. 7I): Hydrogen Anneal

Next, a natural oxide film is removed by a wet etching. Moreover, a hydrogen annealing process is performed. By the hydrogen annealing process, the shape of the deep trench 182 is transformed into the shape in which the vertical section is substantially true circular. The hydrogen annealing process is performed on the condition of 900° C. for 60 seconds.

When the hydrogen annealing process is performed in the state that silicon of the channel dope layer 4 is exposed, silicon atoms are migrated into the direction that a surface energy is minimized. That is, the section is naturally transformed into the shape of the substantially true circle.

When the depth of the deep trench 182 to be formed is assumed to be L, the sectional areas of the trench 182 before and after processing for the circular shape are equal. Thus, from a relation of $L \times W = \pi R^2$, it is possible to obtain the sectional shape in which the curvature radius R is larger than 0.56W.

Step S10 (FIG. 7J): Sacrifice Oxidization

Next, sacrifice oxidization is performed. Consequently, a portion where the silicon is exposed in the lower portion of the trench 18, is covered with a sacrifice oxidization film 12.

Step S11 (FIG. 7K): Removal of Silicon Nitride Film

Next, thermal phosphoric acid is used to remove the silicon nitride film 11.

Step S12 (FIG. 7L): Removal of Sacrifice Oxide Film

Next, a wet-etching is performed to remove the sacrifice oxidization film 12 and the silicon oxide film 10.

Step S13 (FIG. 7M): Formation of Gate Insulating Film

Thermal oxidization is performed to form the gate insulating film 6. The gate insulating film 6 is formed on the semiconductor substrate 20 along the surface of the trench 18. The thickness of the gate insulating film 6 is 10 nm, for example.

Step S14 (FIG. 7N): Formation of Polysilicon Film

Next, a polysilicon film 13 is deposited to fill the trench 18. AT this time, the polysilicon film 13 is on en the surface of the semiconductor substrate 20. At this time, there is a case that a cavity (space) is formed in the lower circular section of the trench. However, the gate insulating film 6 is already formed on the side wall and lower portion of the trench 18 so that the polysilicon film is embedded to cover the gate insulating film. Therefore, there is no influence on the characteristics of the transistor.

Step S15: Formation of Tungsten Silicide

Next, a tungsten silicide layer 15 is formed on the polysilicon film 13. The film thickness of the silicide layer 15 at this time is, for example, 10 nm.

Step S16 (FIG. 7O): Formation of Gate Electrode

Next, the gate electrode 3 is formed. The gate electrode 3 can be formed by using a well-known technique. It should be noted that in FIG. 7O, the cavity (space) 14 is omitted.

Step S17 (FIG. 7P): Formation of n-Type Diffusion Layer

Phosphorus and arsenic are implanted to form the n-type diffusion layer 5. The condition of the phosphorus implantation is $1\times10^{14}$ at 50 KeV. Also, the condition of the arsenic implantation is $1\times10^{15}$ at 20 KeV, for example. Also, after the implantation of them, a thermal process of 1000° C. for about 10 seconds is performed for activation.

Step S18 (FIG. 6): Formation of Electrodes

After that, a silicon oxide film 17 is deposited. Moreover, the well-known photolithography technique and dry-etching technique are used to open holes for the electrodes. Moreover, the electrodes 16 are formed through deposition and processing of a conductive film for the electrode. In this way, the n-type MOS transistor (semiconductor device 30) having the gate electrode of the embedded-in-trench type is produced as shown in FIG. 6.

As described above, in the semiconductor device 30 according to this embodiment, since the deep trench 182 is formed prior to the performing of the hydrogen annealing process (S09), it is possible to form the trench 18 in which the lower section is processed to the shape of the true circle.

Also, since the gate electrode is provided to be embedded in the trench 18 whose lower section is processed to the shape of the true circle, the increase in the sub threshold coefficient can be suppressed, thereby maximizing the ON current of the transistor.

Also, when the trench 18 is formed, the hydrogen annealing process is performed, so that the recovery of the crystal defect generated at the time of the etching is possible. Moreover, unnecessary oxygen contamination can be removed through the reduction action of the hydrogen. Since the trench bottom becomes smooth, the sub channel of the silicon is removed, which can improve the Id-Vg characteristic of the transistor.

It should be noted that in this embodiment, the anisotropic etching is performed to form the deep trench 182. However, the isotropic etching may be performed. From the selection ratio in etching between the silicon nitride film of the side wall mask 19 and the silicon film of the channel dope layer, even if the isotropic etching is performed, it is possible to perform the selective etching in the depth direction. In this case, when the volume of the silicon regressed by the etching is controlled, it is possible to determine the curvature radius of the lower circle of the trench after the hydrogen annealing process.

What is claimed is:

1. A method of manufacturing a semiconductor device, comprising:
    forming a trench having an upper quadrangular section and a lower circular section which is formed through a hydrogen annealing process, to extend in a depth direction of a semiconductor substrate;
    forming an insulating film on a surface of said trench and a surface of said semiconductor substrate; and
    forming a conductive film to fill said trench whose surface is covered with said insulating film,
    wherein a relation $L>W$ is met, where L is a depth for said lower section and W is a width of said upper section of said trench.

2. The method according to claim 1, further comprising:
    forming as source/drain regions, diffusion regions in said semiconductor substrate on both sides of said trench,
    wherein said conductive film is a gate electrode.

3. The method according to claim 1, wherein a relation $L>1.12W$ is met.

4. The method according to claim 1, wherein said forming a trench comprises:
    forming a mask on said semiconductor substrate through an oxide film;
    forming said trench for said upper section by etching a part of said mask and a part of said semiconductor substrate;
    forming a protection film along a side surface of said trench for said upper section;
    forming said trench for said lower section by etching a part of said semiconductor substrate in the depth direction of said semiconductor substrate; and
    performing said hydrogen annealing process to transform said lower section to have a circular section.

5. The method according to claim 4, wherein said mask is a silicon nitride film, said protection film is a laminate layer of a lower protection film of silicon oxide and an upper protection film of silicon nitride, and the oxide film on said semiconductor substrate is a silicon oxide film,
    said forming a trench further comprises:
    forming a sacrificed silicon oxide film on a surface of said lower section;
    removing said mask and said upper protection film; and
    removing the silicon oxide film on said semiconductor substrate, said lower protection film and said sacrificed silicon oxide film.

6. The method according to claim 1, wherein said forming an insulating film comprises:
    forming said insulating film through thermal oxidization.

7. A method of manufacturing a semiconductor device, comprising:
    forming a hard mask on a semiconductor substrate through an oxide film;
    forming a shallow trench by etching a part of said hard mask and said oxide film and a part of said semiconductor substrate;
    forming a protection film along a surface of said shallow trench;
    forming a deep trench in a depth direction from said shallow trench by etching said protection film in a bottom of said shallow trench and another part of said semiconductor substrate while keeping said protection film on a side wall of said shallow trench; and
    processing said deep trench into a circular trench through a hydrogen annealing process,
    wherein a depth L of a portion to be etched in said forming a deep trench meets a relation $L>W$,
    where W is a width of said shallow trench.

8. The method according to claim 7, further comprising:
    forming a gate insulating film along a surface of said circular trench; and
    forming a gate electrode by filling said circular trench whose surface is covered with said gate insulating film.

9. A method of manufacturing a semiconductor device, comprising:
    forming a trench having an upper quadrangular section and a lower circular section which is formed through a hydrogen annealing process, to extend in a depth direction of a semiconductor substrate;
    forming an insulating film on a surface of said trench and a surface of said semiconductor substrate; and forming a conductive film to fill said trench whose surface is covered with said insulating film, wherein the lower circular section of the trench is formed by etching a shallow trench defining the upper quadrangular section to form a deep trench portion; and after forming the deep trench portion, performing said hydrogen annealing to impart a circular section to the deep trench portion.

10. The method according to claim 9, further comprising:

forming as source/drain regions, diffusion regions in said semiconductor substrate on both sides of said trench, wherein said conductive film is a gate electrode.

11. The method according to claim 9, wherein a relation L>W is met, where L is a depth for said lower section and W is a width of said upper section of said trench.

12. The method according to claim 11, wherein a relation L>1.12W is met.

13. The method according to claim 9, wherein said forming a trench comprises:

forming a mask on said semiconductor substrate through an oxide film;

forming said trench for said upper section by etching a part of said mask and a part of said semiconductor substrate;

forming a protection film along a side surface of said trench for said upper section;

forming said trench for said lower section by etching a part of said semiconductor substrate in the depth direction of said semiconductor substrate; and performing said hydrogen annealing process to transform said lower section to have a circular section.

14. The method according to claim 13, wherein said mask is a silicon nitride film, said protection film is a laminate layer of a lower protection film of silicon oxide and an upper protection film of silicon nitride, and the oxide film on said semiconductor substrate is a silicon oxide film, said forming a trench further comprises:

forming a sacrificed silicon oxide film on a surface of said lower section;

removing said mask and said upper protection film; and removing the silicon oxide film on said semiconductor substrate, said lower protection film and said sacrificed silicon oxide film.

15. The method according to claim 9, wherein said forming an insulating film comprises:

forming said insulating film through thermal oxidization.

* * * * *